(12) United States Patent
Muraki et al.

(10) Patent No.: US 7,399,994 B2
(45) Date of Patent: Jul. 15, 2008

(54) TRANSPARENT ELECTRODE

(75) Inventors: Noritaka Muraki, Ichihara (JP);
Munetaka Watanabe, Ichihara (JP);
Yasushi Ohono, Ichihara (JP); Hisayuki Miki, Ichihara (JP)

(73) Assignee: Showa Denka K.K., Tokyo (JP)

( * ) Notice: Subject to any disclaimer, the term of this patent is extended or adjusted under 35 U.S.C. 154(b) by 0 days.

(21) Appl. No.: 11/348,486

(22) Filed: Feb. 7, 2006

(65) Prior Publication Data

US 2006/0175682 A1    Aug. 10, 2006

Related U.S. Application Data

(60) Provisional application No. 60/653,121, filed on Feb. 16, 2005.

(30) Foreign Application Priority Data

Feb. 7, 2005    (JP)    ............................ 2005-030405

(51) Int. Cl.
*H01L 33/00*    (2006.01)
(52) U.S. Cl. ..................... 257/98; 257/88; 257/E33.072

(58) Field of Classification Search ........... 257/79–103, 257/E33.072
See application file for complete search history.

(56) References Cited

FOREIGN PATENT DOCUMENTS

| JP | 5-319998 | 12/1993 |
|---|---|---|
| JP | 9-157092 | 6/1997 |

*Primary Examiner*—Cuong Q Nguyen
(74) *Attorney, Agent, or Firm*—Sughrue Mion, PLLC

(57) ABSTRACT

A transparent electrode for use in a gallium nitride-based compound semiconductor light-emitting device having an emission wavelength of 440 nm or less, includes a metal layer disposed in contiguity to a p-type semiconductor layer and a current diffusion layer disposed on the metal layer. The transparent electrode contains substantially no Au in the whole region thereof. The metal layer contains any one element selected from the group consisting of Pt, Ir, Ru and Rh as a main component. The current diffusion layer contains any one element selected from the group consisting of Pt, Ir, Ru and Rh as a main component except for the case where the metal layer and the current diffusion layer have the same composition. It is possible to provide a white light-emitting device provided with the transparent electrode, a white light-emitting lamp using the white light-emitting device and a lighting fixture using the white light-emitting lamp.

11 Claims, 2 Drawing Sheets

F I G. 1
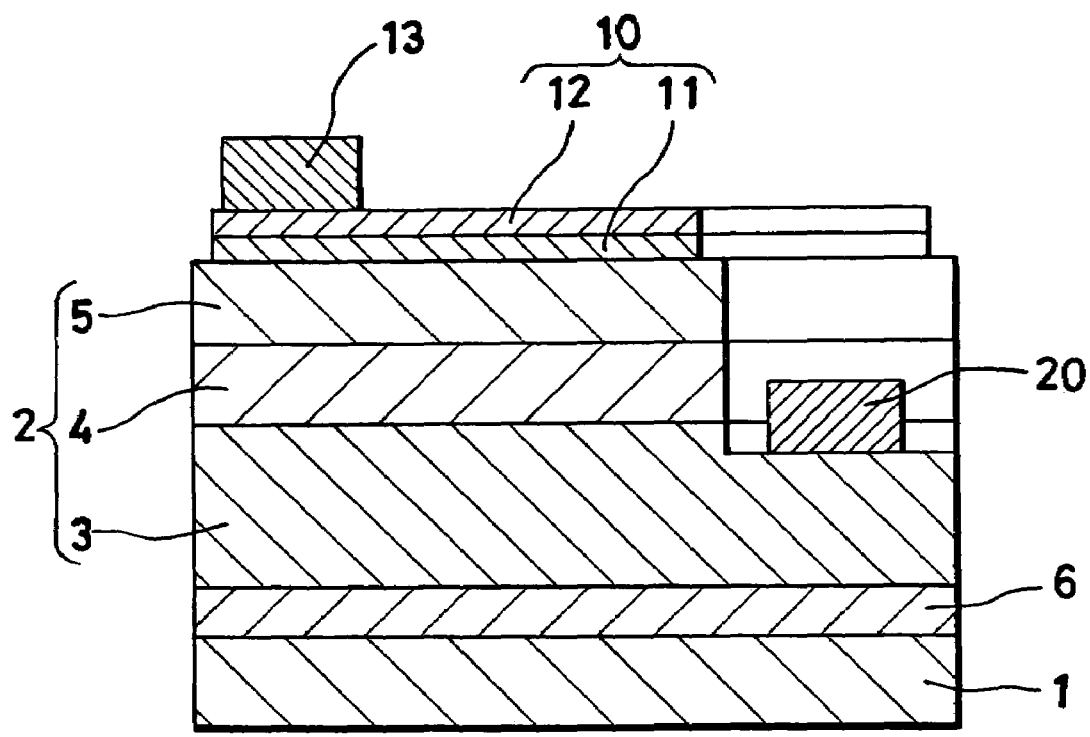

TRANSPARENT ELECTRODE

CROSS REFERENCE TO RELATED APPLICATION

This application is an application filed under 35 U.S.C. 111(a) claiming benefit pursuant to 35 U.S.C. 119(e) of the filing date of Provisional Application 60/653,121 on Feb. 16, 2005, pursuant to 35 U.S.C. 111(b).

BACKGROUND OF THE INVENTION

1. Field of the Invention

This invention relates to a transparent electrode (positive electrode) and particularly to a transparent electrode possessing excellent perviousness and an ohmic property and fit for use in a gallium nitride-based compound semiconductor light-emitting device which releases an emission in the ultraviolet region.

2. Description of Prior Art

In recent years, the GaN-based compound semiconductor material has been attracting attention as a semiconductor material for use in a short wavelength light-emitting device. The GaN-based compound semiconductor is formed by using a varying oxide substrate starting with sapphire single crystal or a varying Group III-V compound substrate and stacking a relevant compound thereon by the metalorganic chemical vapor deposition method (MOCVD method), molecular beam epitaxy method (MBE method), etc.

The GaN-based compound semiconductor material is characterized by the smallness of current diffusion in the lateral direction. Though the cause for this small current diffusion has not been thoroughly elucidated, it may be logically ascribed to the presence of numerous dislocations occurring in an epitaxial crystal and threading the surface thereof from a substrate. Further, the p-type GaN-based compound semiconductor (occasionally abbreviated hereinafter as a "p layer") has a high specific resistance as compared with the specific resistance of the n-type GaN-based compound semiconductor. The p-type semiconductor layer, when having a metal simply stacked on the surface thereof, exhibits substantially no lateral diffusion of current therein. When an LED structure is provided with a p-n junction, it emits light only directly below a positive electrode.

In the circumstances, the practice of enhancing the diffusibility of current in the p layer by lowering the specific resistance of the p layer by dint of the radiation of electron beams or the anneal at a high temperature is in vogue. The radiation of electron beams, however, necessitates a very expensive device and does not prove advantageous in terms of cost of production. It further incurs difficulty in imparting a uniform treatment to the whole interior of the wafer. The annealing treatment at a high temperature requires the process to proceed at a temperature exceeding 900° C. for the sake of enabling the effect thereof to be manifested conspicuously. During this process, the crystal structure of the GaN begins to decompose and the possibly ensuing desorption of nitrogen results in degrading the voltage characteristic in the reverse direction.

It has been proposed to promote the decrease of the specific resistance of the p layer and accomplish the formation of a positive electrode endowed with perviousness and an ohmic property by depositing Ni and Au each in an approximate thickness of several tens of nm on the p layer and subjecting the resultant composite positive electrode to an alloying treatment (refer, for example, to Japanese Patent No. 2803742).

In the case of the transparent electrode using Au, however, the use thereof in a device for emitting ultraviolet rays entails the problem that the output of emission is decreased to a great extent. Though Au is a metal that exhibits an excellent transmission factor in the blue color region, it cannot be expected to excel in transmittance because the transmission factor thereof in the ultraviolet region not exceeding 440 nm is about 90% of that in the blue color region.

Then, the alloying treatment in the atmosphere of oxygen entails such problems as giving rise to an oxide layer on the surface of the exposed n-type GaN layer, affecting the ohmic property of the negative electrode, causing the electrode to form a network structure and tending to induce uneven emission.

It has been further proposed to enable the p layer to attain a decrease of the specific resistance and undergo an alloying treatment simultaneously by forming a positive electrode of Pt on the p layer and heat-treating the resultant substance in an atmosphere containing oxygen (refer, for example, to JP-A HEI 11-186605). This method, however, also entails the aforementioned problem because it requires a heat treatment in an atmosphere of oxygen. In order for the simple substance of Pt to form an excellent transparent electrode, the thickness of the electrode must be decreased to a veritably thorough extent (5 nm or less). This necessity results in heightening the electric resistance of the Pt layer, impairing the diffusion of current even when the decrease of the specific resistance of the Pt layer is attained by the heat treatment, depriving the emission of uniformity and inducing a rise of the voltage in the forward direction ($V_F$) and a drop of the intensity of emission.

This invention, with the object of solving the problem mentioned above, is aimed at providing an electrode (positive electrode) exhibiting excellent perviousness in the ultraviolet region, acquiring a low contact resistance and excelling in diffusibility of current without undergoing irradiation with electron beams, an anneal at a high temperature or an alloying heat treatment in an oxygen atmosphere.

SUMMARY OF THE INVENTION

This invention which has been perfected with a view to accomplishing the object mentioned above provides, as the first aspect thereof, a transparent electrode for use in a gallium nitride-based compound semiconductor light-emitting device having an emission wavelength of 440 nm or less, comprising a metal layer disposed in contiguity to a p-type semiconductor layer and a current diffusion layer disposed on the metal layer, the transparent electrode containing substantially no gold (Au) in the whole region thereof, the metal layer containing any one element selected from the group consisting of Pt, Ir, Ru and Rh as a main component, and the current diffusion layer containing any one element selected from the group consisting of Pt, Ir, Ru and Rh as a main component except for the case where the metal layer and the current diffusion layer have a same composition.

In the second aspect of the invention that includes the first aspect, the transparent electrode has an emission wavelength in a range of 300 nm to 440 nm.

In the third aspect of the invention that includes the first or second aspect, the transparent electrode contains Pt as a main component in a region contiguous to the p-type semiconductor layer.

In the fourth aspect of the invention that includes any of the first to third aspects, the metal layer has Pt as a main component and the current diffusion layer has any one element selected from the group consisting of Pt, Ir, Ru and Rh as a main component.

In the fifth aspect of the invention that includes any of the first to fourth aspects, the metal layer has a film thickness in a range of 0.1 to 20 nm.

In the sixth aspect of the invention that include any of the first to fifth aspects, the current diffusion layer has a thickness in a range of 1 to 20 nm.

In the seventh aspect of the invention that includes any of the first to sixth aspects, the metal layer and the current diffusion layer formed thereon have not undergone a heat treatment.

In the eighth aspect of the invention that includes any of the first to seventh aspects, light transmitted through the transparent electrode is 60% or more of incident light.

The present invention also provides, as the ninth aspect thereof, a white light-emitting device provided with the transparent electrode according to any of the first to eighth aspects.

The present invention also provides, as the tenth aspect thereof, a white light-emitting lamp using the white light-emitting device according to the ninth aspect.

The present invention also provides, as the eleventh aspect thereof, a lighting fixture using the white light-emitting lamp according to the tenth aspect.

The transparent electrode containing substantially no Au, exhibiting excellent perviousness even in the ultraviolet region and having a thin layer of a metal, such as platinum, possessing low contact resistance to a p-type GaN-based compound semiconductor layer as a metal layer (contact metal layer) disposed in contact with the p-type GaN-based compound semiconductor layer, excels in the property of fetching the light emitted from a device to the exterior without being obstructed. The term "substantially no Au" used herein means that the Au content is 1% or less, preferably 0.1% or more. Then, the transparent positive electrode of this invention which has been further provided thereon with a current diffusion layer having a larger electric conductivity (a smaller specific resistance) than the contact metal layer allows enhanced diffusion of current in the plane direction and consequently makes it possible to produce a high-luminance light-emitting device having low voltage in the forward direction ($V_F$ value) and emitting light uniformly throughout the entire surface of the positive electrode.

The above and other objects, characteristic features and advantages of the present invention will become apparent to those skilled in the art from the description given herein below with reference to the accompanying drawings.

BRIEF DESCRIPTION OF THE DRAWINGS

FIG. 1 is a schematic cross-sectional view illustrating a light-emitting device provided with a transparent positive electrode of this invention.

DETAILED DESCRIPTION OF PREFERRED EMBODIMENTS

Figure 2:
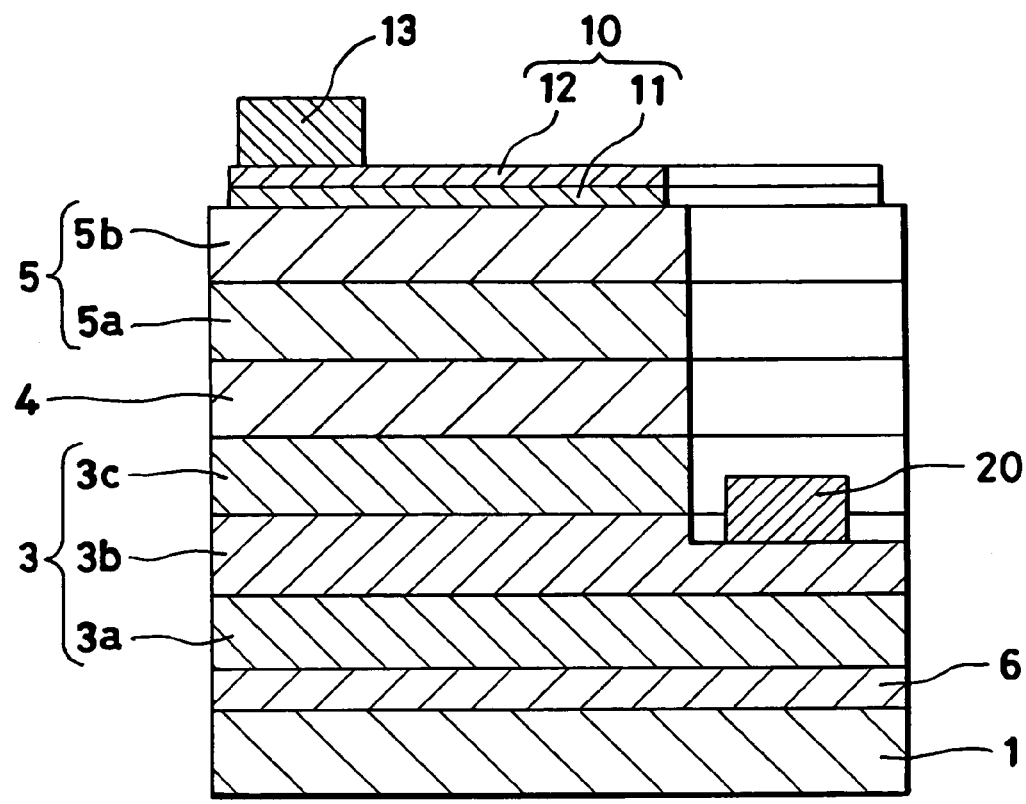
FIG. 2 is a schematic cross-sectional view illustrating a gallium nitride-based compound semiconductor light-emitting device provided with a transparent positive electrode of this invention produced in Example 1.

The transparent positive electrode of this invention is formed of a metal containing no gold in any region and will be explained below with reference to the accompanying drawings.

FIG. 1 is a schematic cross-sectional view illustrating a light-emitting device provided with a transparent positive electrode of this invention, wherein reference numeral 11 denotes a contact metal layer, numeral 12 a current diffusion layer, numeral 13 a bonding pad layer. Reference numerals 11 and 12 constitute a transparent positive electrode 10 of this invention. Further, reference numeral 1 denotes a substrate, numeral 2 a GaN-based compound semiconductor layer that exhibits light emission in the ultraviolet region and comprises an n-type semiconductor layer 3, a light-emitting layer 4 and a p-type GaN-based compound semiconductor layer 5, numeral 6 a buffer layer and numeral 20 a negative electrode.

The transparent electrode comprising a contact metal layer and a current diffusion layer is enabled, by not containing Au in any of the regions thereof, to permit satisfactory transmission of light in the ultraviolet region.

The nature which the contact metal layer is expected to have essentially consists in the smallness of the contact resistance with the p-type GaN-based compound semiconductor layer. Further, the face-up mount type light-emitting device for fetching the light in the ultraviolet region from the light-emitting layer via the electrode plane side is expected to excel in light perviousness.

The material of the contact metal layer, from the viewpoint of the contact resistance with the p-type GaN-based compound semiconductor layer and the transmission factor of the ultraviolet light, contains at least one element selected from the group consisting of platinum (Pt), ruthenium (Ru), rhodium (Rh) and iridium (Ir) as a main component. Among other elements enumerated above, Pt proves particularly advantageous because it possesses a high work function and enables a p-type GaN-based compound semiconductor layer which has undergone no heat treatment at a high temperature and exhibits relatively high resistance to acquire excellent ohmic resistance without heating.

When the contact metal layer is formed of platinum, for example, it is necessary from the viewpoint of the perviousness to light that the thickness of this layer be very small. The thickness of the contact metal layer is preferably in the range of 0.1 to 20 nm. If the thickness falls short of 0.1 nm, the shortage will prevent the thin layer from being easily obtained stably. If the thickness exceeds 20 nm, the overage will result in lowering the perviousness to light. This range more preferably has an upper limit of 10 nm or less. In consideration of the degradation of the perviousness due to the subsequent stacking of a current diffusion layer and the stability of the formation of the film, the range of 0.5 to 6 nm proves particularly advantageous.

However, the decrease of the thickness of the contact metal layer results in heightening the electrical resistance in the plane direction of the contact metal layer and this heightened electrical resistance coupled with the relatively high resistance of the p-type semiconductor layer prevents the current from being diffused in any part except the peripheral part of the pad layer which is a part for current injection. As a result, the emission pattern is deprived of uniformity and the emission output is degraded.

Thus, by having disposed on the contact metal layer a current diffusion layer formed of a thin film of a highly optically pervious and highly electroconductive metal as a means for compensating for the current diffusing property of the contact metal layer, it is made possible to diffuse the current uniformly without seriously impairing the low contact resistance and the optical perviousness of the thin film of metal.

The material of the current diffusion layer contains at least one element selected from the group consisting of platinum (Pt), ruthenium (Rh), Rhodium (Rh) and iridium (Ir) as a main component. Besides, metals of high degrees of electric conductivity other than Au, namely silver, copper and alloys thereof, may be incorporated therein to an extent incapable of impairing the perviousness. While the elements enumerated above are the same as those of the contact metal layer, different elements are selected for the current diffusion layer and the contact metal layer which are used in combination. The most preferable combination of such elements resides between Pt for the contact metal layer and any one element selected as a main component for the current diffusion layer from the group consisting of Pt, Ir, Ru and Rh.

The thickness of the current diffusion layer is preferably in the range of 1 to 20 nm. If the thickness falls short of 1 nm, the shortage will prevent the effect of diffusing the current from being fully manifested. If it exceeds 20 nm, the overage will possibly result in markedly degrading the optical perviousness of the current diffusion layer and degrading the output of the emission. It is more preferably 10 nm or less. By further limiting the thickness within the range of 3 to 6 nm, it is made possible to optimize the balance between the optical perviousness of the current diffusion layer and the effect of current diffusion, allow the positive electrode, when combined with the contact metal layer, to generate uniform emission throughout the entire surface and to acquire the emission with high output. The term "perviousness" as used in this invention means the light transparent property in the wavelength region of 440 nm or less, particularly in the range of 300 to 400 nm, though it does not need to be perfectly transparent. Preferably, the perviousness permits passage of 60% or more of a given light.

The method for forming the contact metal layer and the current diffusion layer does not need to be particularly restricted but may be selected from among publicly known methods, such as vacuum deposition and sputtering.

The bonding pad layer for constituting the bonding pad part has been known in various structures using various materials. Such publicly known bonding pad layers may be adopted without imposing any particular restriction. A five-layer Au/Ti/Al/Ti/Au structure may be cited, for example. The bonding pad layer preferably uses a material exhibiting satisfactory adherence to the current diffusion layer and possesses a thickness sufficient for preventing the stress generated during the course of bonding from inflicting damage on the contact metal layer or the current diffusion layer. The outermost surface layer is preferred to be formed of a material, such as Au, which exhibits perfect adhesion to the bonding ball.

The transparent positive electrode contemplated by this invention can be used without any restriction at all for the conventional publicly known gallium nitride compound semiconductor light-emitting device which is formed as illustrated in FIG. 1 by stacking a gallium nitride-based compound semiconductor through a buffer layer on a substrate and forming thereon an n-type semiconductor layer, a light-emitting layer and a p-type semiconductor layer.

For the substrate, any of publicly known substrate materials, such as oxide single crystals including sapphire single crystal ($Al_2O_3$; A plane, C plane, M plane and R plane), spinel single crystal ($MgAl_2O_4$), ZnO single crystal, $LiAlO_2$ single crystal, $LiGaO_2$ single crystal and MgO single crystal, Si single crystal, SiC single crystal, GaAs single crystal, AlN single crystal, GaN single crystal, and boride single crystals including $ZrB_2$ can be used without any restriction of any sort. Incidentally, the plane orientation of the substrate is not particularly restricted. The substrate may be a just substrate or a substrate endowed with an off angle.

The n-type semiconductor layer, light-emitting layer and p-type semiconductor layer are widely known in various structures and these widely known layers can be used. Though particularly the p-type semiconductor layer uses an ordinary carrier concentration, the transparent positive electrode of this invention can be applied even to the p-type semiconductor layer that has a relatively low carrier concentration approximating $1 \times 10^{17}$ $cm^3$, for example.

The gallium nitride-based compound semiconductor is widely known in various compositions which are represented by the general formula, $Al_xIn_yGa_{1-x-y}N$ ($0 \leq x < 1$, $0 \leq y < 1$, $0 \leq x+y < 1$). For the gallium nitride-based compound semiconductors which form the n-type semiconductor layer and p-type semiconductor layer, these widely known semiconductors of varying compositions represented by the general formula, $Al_xIn_yGa_{1-x-y}N$ ($0 \leq x < 1$, $0 \leq y < 1$, $0 \leq x+y < 1$) can be used without any restriction of any sort.

The active layer uses a composition having an In concentration of approximately 10% or less for the purpose of emitting a light in the ultraviolet region. This composition may be controlled by the film thickness of the well layer, the composition of the barrier layer and the carrier concentration of the active layer.

The method for growing the gallium nitride-based compound semiconductor does not need to be particularly restricted. Any of methods, such as MOCVD (metalorganic chemical vapor deposition) method, HVPE (hydride vapor phase epitaxy) method, and MBE (molecular beam epitaxy) method which are known to attain growth of a Group III nitride semiconductor can be adopted. From the viewpoint of the film thickness controlling property and the mass productivity, the preferred method of growth is the MOCVD method. The MOCVD uses hydrogen ($H_2$) or nitrogen ($N_2$) as the carrier gas, trimethyl gallium (TMG) or triethyl gallium (TEG) as the Ga source for the Group III raw material, trimethyl aluminum (TMA) or triethyl aluminum (TEA) as the Al source, trimethyl indium (TMI) or triethyl indium (TEI) as the In source, and ammonia ($NH_3$) or hydrazine ($N_2H_4$) as the N source for the Group V raw material. As the dopant, monosilane ($SiH_4$) or disilane ($Si_2H_6$) as the Si raw material and germane ($GeH_4$) as the Ge raw material in the n-type and biscyclopentadienyl magnesium ($Cp_2Mg$) or bisethyl cyclopentadienyl magnesium (($EtCp)_2Mg$), for example, as the Mg raw material in the p-type.

For the purpose of forming a negative electrode in contact with the n-type semiconductor layer of the gallium nitride-based compound semiconductor resulting from sequentially stacking an n-type semiconductor layer, a light-emitting layer and a p-type semiconductor layer on a substrate, the light-emitting layer and the p-type semiconductor layer are partly removed to expose the n-type semiconductor layer. Thereafter, the transparent positive electrode of this invention is formed on the remainder of the p-type semiconductor layer and the negative electrode is formed on the exposed n-type semiconductor layer. The negative electrode is widely known in various compositions and structures. These widely known negative electrodes can be used without any restriction of any sort.

Now, this invention will be described more specifically below with reference to examples. This invention is not limited to the examples.

EXAMPLE 1

Figure 3:
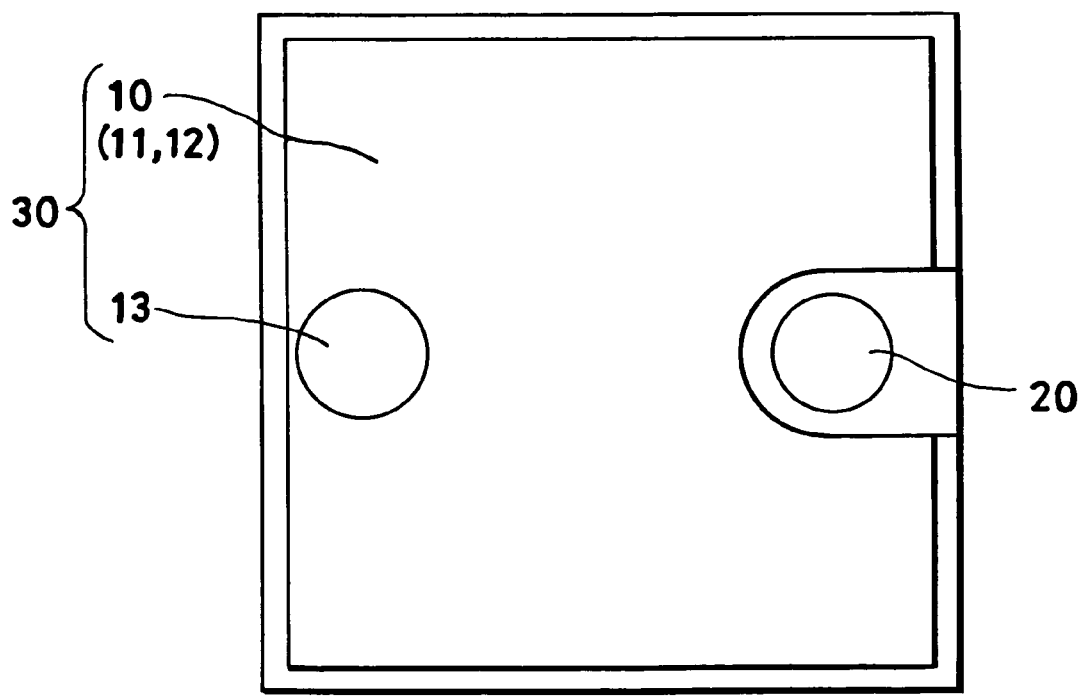
FIG. 3 is a schematic plan view illustrating a gallium nitride-based compound semiconductor light-emitting device provided with a transparent positive electrode of this invention produced in Example 1.

FIG. 2 is a schematic cross-sectional view illustrating a gallium nitride-based compound semiconductor ultraviolet light-emitting device fabricated in this example and FIG. 3 is a schematic plan view thereof. On a substrate 1 formed of sapphire, an undoped under layer 3a formed of GaN in a thickness of 8 μm, an Si-doped n-type AlGaN contact layer 3b in a thickness of 2 μm, an n-type $In_{0.1}Ga_{0.9}N$ clad layer 3c in a thickness of 0.03 μm were stacked through an AlN buffer layer 6, an Si-doped $Al_{0.1}Ga_{0.9}N$ barrier layer in a thickness of 16 nm and an $In_{0.02}G_{0.98}N$ well layer in thickness of 4 nm were stacked thereon alternately to a total of five cycles, and finally a light-emitting layer 4 of a multiple quantum well structure provided with a barrier layer, an Mg-doped p-type $Al_{0.07}Ga_{0.93}N$ clad layer 5a in a thickness of 0.01 μm and an Mg-doped p-type AlGaN contact layer 5b in a thickness of 0.15 μm were sequentially stacked thereon. On the p-type AlGaN contact layer of the gallium nitride-based compound semiconductor, a Pt contact metal layer 11 in a thickness of 1.5 nm and a Rh current diffusion layer 12 in a thickness of 3 nm were stacked to form a positive electrode 10 of this invention. On the current diffusion layer, a bonding pad layer 13 of a five-layer Au/Ti/Al/Ti/Au structure (having thicknesses respectively of 50/20/10/100/200 nm) was formed. Then, a negative electrode 20 of a two-layer Ti/Au structure was formed on the n-type AlGaN contact layer to give rise to a light-emitting device having a light fetching plane on the semiconductor side. The positive electrode and the negative electrode are shaped as illustrated in FIG. 3.

In this structure, the carrier concentration of the n-type AlGaN contact layer was $1 \times 10^{19}$ $cm^{-3}$, the amount of Si dopant in the AlGaN barrier layer was $1 \times 10^{18}$ $cm^{-3}$, the carrier concentration of the p-type AlGaN contact layer was $5 \times 10^{18}$ $cm^{-3}$, and the amount of Mg dopant in the p-type AlGaN clad layer was $5 \times 10^{19}$ $cm^{-3}$.

The stacking of the gallium nitride-based compound semiconductor layer was carried out by the MOCVD under the conditions well known in the relevant technical field. The positive electrode and the negative electrode were formed by the following procedure.

First, part of the n-type AlGaN contact layer on which the negative electrode is formed by the reactive ion etching technique was exposed by the following procedure.

For a start, an etching mask was formed on the p-type semiconductor layer. This formation was performed as follows. A resist was uniformly applied to the whole surface and the applied coat of resist was removed from a region one size larger than the positive electrode region by the publicly known lithographic technique. The resultant masked p-type semiconductor layer was set in a vacuum deposition device and Ni and Ti were deposited thereon in respective film thicknesses of about 50 nm and 300 nm by the electron beam technique under a pressure of $4 \times 10^{-4}$ Pa or less. Thereafter, the metal film was removed together with the resist from outside the positive electrode region by the lift-off technique.

Subsequently, the semiconductor-stacked substrate was mounted on the electrode inside the etching chamber of the reactive ion etching device, the etching chamber was decompressed to $10^{-4}$ Pa, and $Cl_2$ was supplied to the chamber as the etching gas, and the etching was continued till the n-type AlGaN contact layer was exposed. After the etching, the semiconductor-stacked substrate was withdrawn from the reactive ion etching device and the etching mask was removed with nitric acid and hydrofluoric acid.

Then, by using the publicly known photolithographic technique and lift-off technique, a contact metal layer formed of Pt and a current diffusion layer formed of Rh were formed exclusively in the region for forming the positive electrode on the p-type AlGaN contact layer. In the formation of the contact metal layer and the current diffusion layer, first the substrate having the gallium nitride-based compound semiconductor layer stacked thereon was placed in a vacuum deposition device and Pt was first deposited in a thickness of 1.5 nm and Rh was then deposited in a thickness of 3 nm on the p-type AlGaN contact layer. Thus, the positive electrode of this invention was formed on the p-type AlGaN contact layer. Subsequently, the resultant substrate was withdrawn from the vacuum chamber and treated in accordance with the widely known procedure generally called the "lift-off." Further, by the similar procedure, a bonding pad layer was formed on part of the current diffusion layer by sequentially stacking a first layer formed of Au, a second layer formed of Ti, a third layer formed of Al, a fourth layer formed of Ti and a fifth layer formed of Au.

This invention prohibits the transparent electrode part from containing Au and gives no heed whatever to the inclusion of Au in the bonding pad. Au is a metal which excels in the bonding property. The formation of Au as the uppermost layer of the bonding pad, for example, constitutes itself rather a commonplace.

The positive electrode formed by this method exhibits perviousness and possesses a light transmission factor of 70% in the wavelength region of 405 nm. This light transmission factor was determined by using a sample which had been obtained by forming the same contact metal layer and current diffusion layer as mentioned above in a size prescribed for the determination of a light transmission factor.

Then, the negative electrode was formed on the exposed n-type GaN contact layer in accordance with the following procedure. The resist was uniformly applied to the whole surface, the applied coat of the resist was removed from the part for forming the negative electrode on the exposed n-type AlGaN contact layer by the publicly known lithographic technique, and the negative electrode consisting of Ti 100 nm thick and Au 200 nm thick stacked sequentially in the order mentioned from the semiconductor side by the vacuum deposition technique in popular use was formed. Thereafter, the resist was removed by the publicly known technique.

The wafer which had the positive electrode and the negative electrode formed thereon as described above had the second surface of the substrate ground and polished till the thickness of the substrate decreased to 80 μm. It was inscribed with a mark-off line from the semiconductor-deposited side by the use of a laser scriber. The wafer was divided under pressure into chips each measuring the square of 350 μm. When these chips were subsequently tested for the voltage in the forward direction at amperage of 20 mA by exposure to the electric current conducted by a probing needle, the voltage was found to be 2.9 V.

Subsequently, when the chips were mounted on a TO-18 can package and tested for emission output with a tester, the emission output at an amperage of 20 mA was found to be 7 mW. As regards the emission distribution on the emission plane, the chips were confirmed to be emitting light throughout the entire surface of the positive electrode.

COMPARATIVE EXAMPLE 1

A light-emitting device was fabricated by following the procedure of Example 1 while forming on the same nitride semiconductor-deposited substrate the conventional electrode formed of Au/NiO. The voltage in the forward direction and the emission output of this light-emitting device were found to be respectively 2.9 V and 3.0 mW When the emission plane of the device was visually observed, it was found to emit light throughout the entire surface similarly to the same of Example 1. The contact metal layer, however, was found to possess a light transmission factor of about 40% and, therefore, considered to suffer a decrease of emission output.

The electrode provided by this invention for use in the gallium nitride-based compound semiconductor light-emitting device is useful as the positive electrode for the transparent gallium nitride-based compound light-emitting device which emits an ultraviolet light.

What is claimed is:

1. A transparent electrode for use in a gallium nitride-based compound semiconductor light-emitting device having an emission wavelength of 440 nm or less, comprising a transparent metal layer disposed in contiguity to a p-type semiconductor layer and a transparent current diffusion layer disposed on the transparent metal layer, the transparent electrode containing substantially no Au in a whole region thereof, the transparent metal layer containing at least one metal selected from the group consisting of Pt, Ir, Ru and Rh as a main component, and the transparent current diffusion layer containing at least one metal selected from the group consisting of Ir, Ru and Rh as a main component, with the proviso that the transparent metal layer and the transparent current diffusion layer do not have the same composition.

2. A transparent electrode according to claim 1, wherein the emission wavelength is in a range of 300 nm to 440 nm.

3. A transparent electrode according to claim 1, wherein the transparent electrode contains Pt as a main component in a region contiguous to the p-type semiconductor layer.

4. A transparent electrode according to claim 1, wherein the transparent metal layer has Pt as a main component.

5. A transparent electrode according to claim 1, wherein the transparent metal layer has a film thickness in a range of 0.1 to 20 nm.

6. A transparent electrode according to claim 1, wherein the transparent current diffusion layer has a thickness in a range of 1 to 20 nm.

7. A transparent electrode according to claim 1, wherein light transmitted through the transparent electrode is 60% or more of incident light.

8. A white light-emitting device provided with the transparent electrode according to claim 1.

9. A white light-emitting lamp using the white light-emitting device according to claim 8.

10. A lighting fixture using the white light-emitting lamp according to claim 9.

11. A transparent electrode according to claim 1, wherein the transparent current diffusion layer has a lower specific resistance than that of the transparent metal layer.

* * * * *